United States Patent
Cheng et al.

(10) Patent No.: US 9,773,881 B2
(45) Date of Patent: Sep. 26, 2017

(54) ETCH STOP FOR AIRGAP PROTECTION

(71) Applicants: INTERNATIONAL BUSINESS MACHINES CORPORATION, Armonk, NY (US); GLOBALFOUNDRIES INC., Grand Cayman (KY)

(72) Inventors: Kangguo Cheng, Schenectady, NY (US); Ruilong Xie, Niskayuna, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/233,315

(22) Filed: Aug. 10, 2016

(65) Prior Publication Data

US 2017/0125539 A1     May 4, 2017

Related U.S. Application Data

(63) Continuation of application No. 14/930,895, filed on Nov. 3, 2015, now Pat. No. 9,536,982.

(51) Int. Cl.
| | |
|---|---|
| *H01L 21/8232* | (2006.01) |
| *H01L 29/49* | (2006.01) |
| *H01L 29/78* | (2006.01) |
| *H01L 29/423* | (2006.01) |
| *H01L 29/66* | (2006.01) |
| *H01L 29/40* | (2006.01) |

(Continued)

(52) U.S. Cl.
CPC ........ *H01L 29/4991* (2013.01); *H01L 29/401* (2013.01); *H01L 29/42376* (2013.01); *H01L 29/66795* (2013.01); *H01L 29/7851* (2013.01); *H01L 21/823468* (2013.01); *H01L 21/823864* (2013.01)

(58) Field of Classification Search
CPC ................ H01L 21/823468; H01L 21/823864
USPC .......................................... 257/288; 438/303
See application file for complete search history.

(56) References Cited

U.S. PATENT DOCUMENTS

| | | | | |
|---|---|---|---|---|
| 5,736,446 A | * | 4/1998 | Wu ...................... | H01L 21/2254 257/E21.148 |
| 6,468,877 B1 | * | 10/2002 | Pradeep ................ | H01L 21/764 257/E21.573 |
| 7,709,910 B2 | | 5/2010 | Henson et al. | |

(Continued)

OTHER PUBLICATIONS

List of IBM Patents or Patent Applications Treated as Related dated Aug. 10, 2016, 2 pages.

*Primary Examiner* — George Fourson, III
(74) *Attorney, Agent, or Firm* — Tutunjian & Bitetto, P.C.; Vazken Alexanian

(57) ABSTRACT

A semiconductor device that includes a gate structure on a channel region of a semiconductor device. Source and drain regions may be present on opposing sides of the channel region. The semiconductor device may further include a composite gate sidewall spacer present on a sidewall of the gate structure. The composite gate sidewall spacer may include a first composition portion having an air gap encapsulated therein, and a second composition portion that is entirely solid and present atop the first composition portion.

19 Claims, 8 Drawing Sheets

(51) Int. Cl.
*H01L 21/8238* (2006.01)
*H01L 21/8234* (2006.01)

(56) References Cited

U.S. PATENT DOCUMENTS

| | | | |
|---|---|---|---|
| 7,741,663 B2 | 6/2010 | Hause et al. | |
| 7,871,923 B2 | 1/2011 | Liu et al. | |
| 8,298,911 B2 | 10/2012 | Lee | |
| 8,390,079 B2 | 3/2013 | Horak et al. | |
| 8,629,560 B2 | 1/2014 | Liu et al. | |
| 8,637,930 B2 * | 1/2014 | Ando | H01L 29/785 257/347 |
| 8,871,624 B2 | 10/2014 | Horak et al. | |
| 8,940,632 B2 | 1/2015 | Nam | |
| 8,999,839 B2 | 4/2015 | Su et al. | |
| 9,437,694 B1 * | 9/2016 | Gaumer | H01L 29/41783 |
| 2008/0040697 A1 * | 2/2008 | Chidambarrao | H01L 21/82380 257/510 |
| 2008/0283937 A1 * | 11/2008 | Shin | H01L 21/7682 257/408 |
| 2010/0102363 A1 * | 4/2010 | Hause | H01L 29/41775 257/288 |
| 2011/0121398 A1 * | 5/2011 | Hoentschel | H01L 21/26513 257/369 |
| 2011/0309416 A1 | 12/2011 | Yamashita et al. | |
| 2012/0064707 A1 * | 3/2012 | Yang | H01L 21/28247 438/588 |
| 2012/0126302 A1 * | 5/2012 | Noda | H01L 21/764 257/315 |
| 2012/0205810 A1 | 8/2012 | Kim | |
| 2014/0327054 A1 * | 11/2014 | Adam | H01L 29/6656 257/288 |
| 2015/0263122 A1 * | 9/2015 | Hsiao | H01L 29/515 257/401 |
| 2016/0013313 A1 * | 1/2016 | Cheng | H01L 29/267 257/408 |
| 2016/0099245 A1 * | 4/2016 | Cheng | H01L 27/0924 257/401 |

* cited by examiner

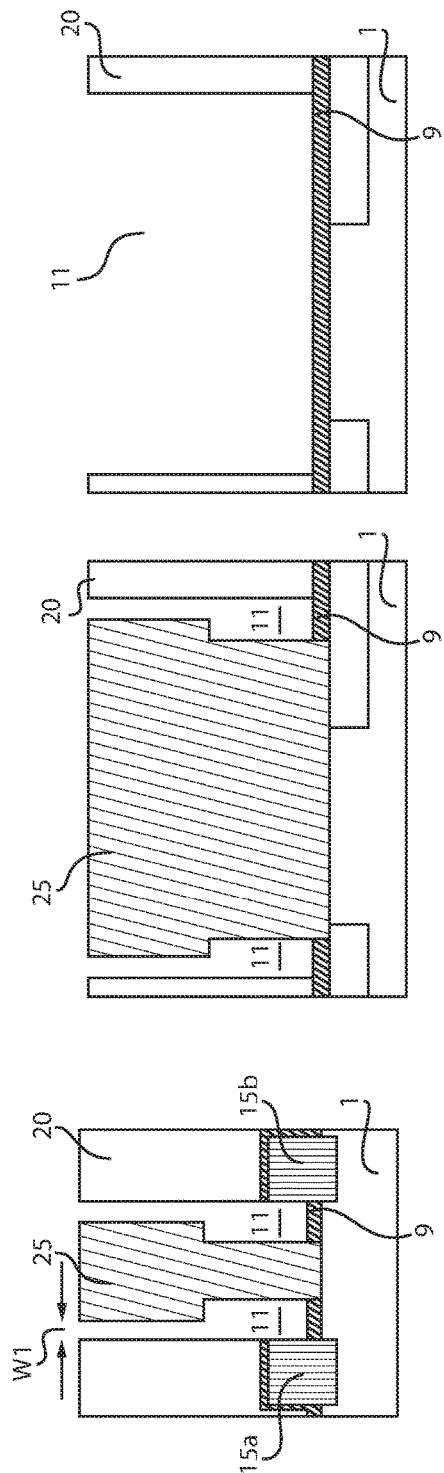
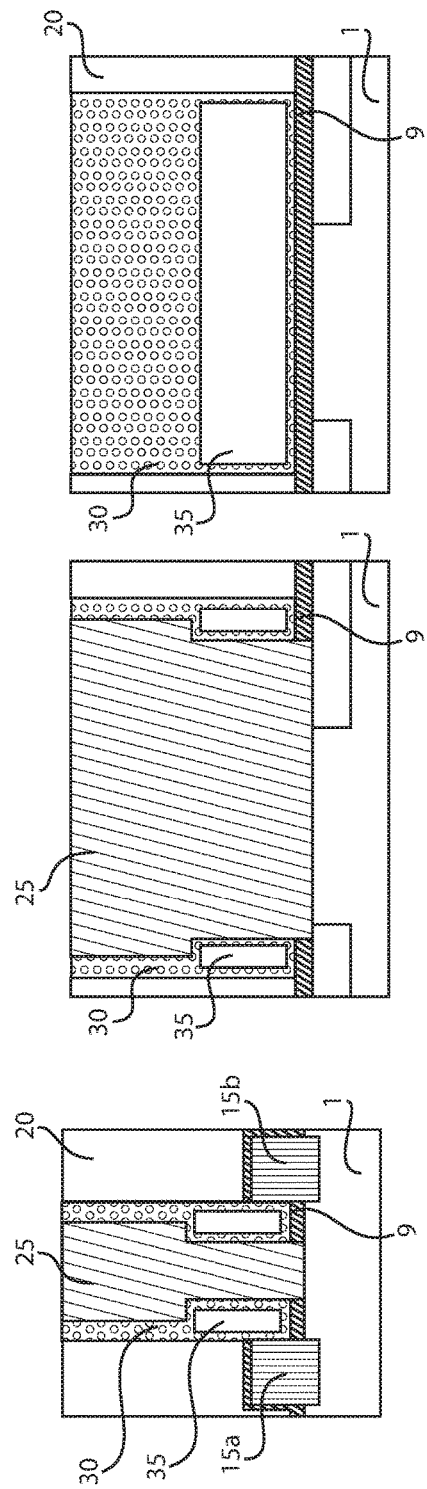

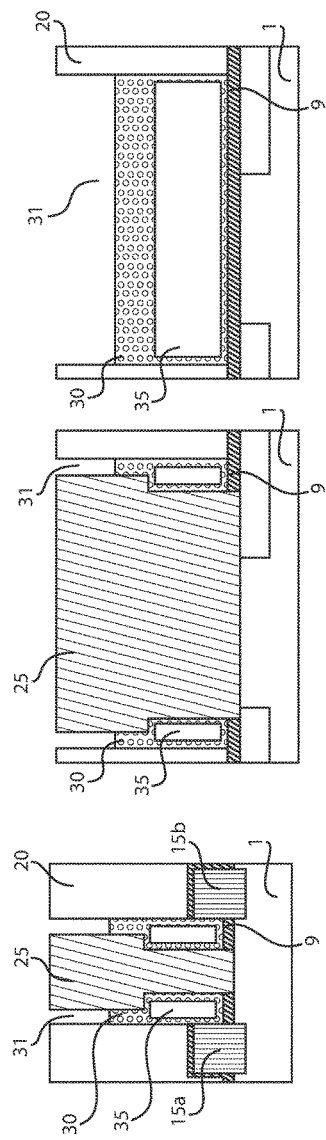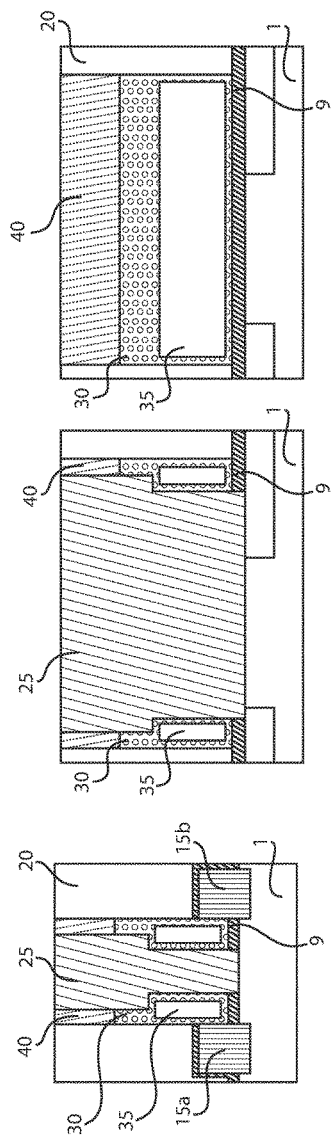

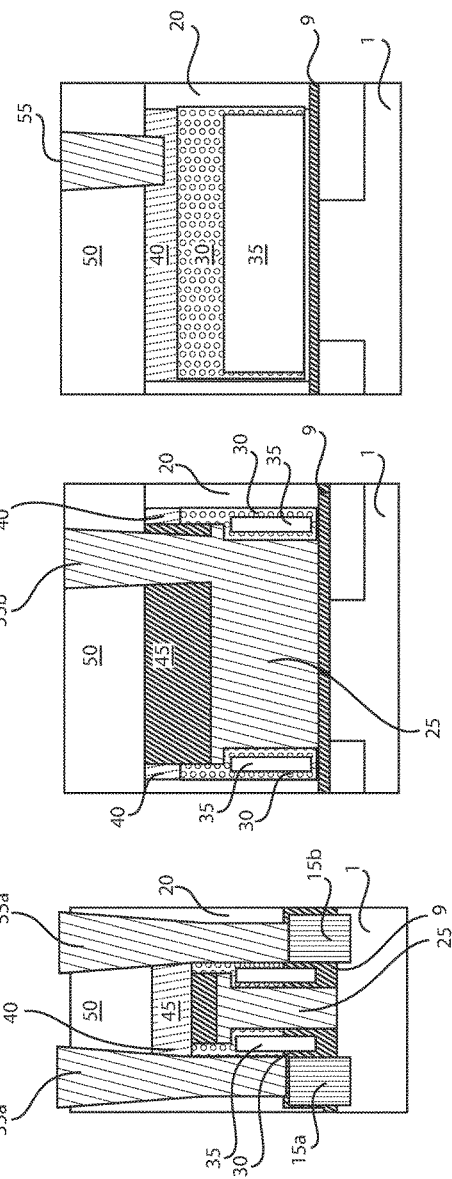

ETCH STOP FOR AIRGAP PROTECTION

BACKGROUND

Technical Field

The present disclosure relates to semiconductor devices, and more particularly to semiconductor devices including dielectric spacers and air gaps.

Description of the Related Art

With the continuing trend towards miniaturization of integrated circuits (ICs), there is a need for transistors to have higher drive currents with increasingly smaller dimensions. Low-k dielectric materials and arrangements for incorporating low-k materials into semiconductor devices may be advantageous for reducing unintended device capacitance than can occur as device dimensions continue to be scaled.

SUMMARY

In one embodiment, a method of forming a semiconductor device is provided that includes a composite dielectric spacer including an air gap. The cap portion of the composite dielectric spacer may be comprised of an etch resistant material to protect the integrity of the air gap during etch processing to form the contacts to the source and drain regions of the device. In one embodiment, the method may include providing a sacrificial gate structure on a channel region of semiconductor device, wherein sacrificial pacers are present on sidewalls of the sacrificial gate structure. The sacrificial gate structure may then be recessed. An interior surface of sacrificial spacers that is exposed by recessing the sacrificial gate structure may then be laterally etched. The remainder of the sacrificial gate structure may then be substituted with a functional gate structure. The sacrificial spacer may be removed to provide a spacer opening having a lesser width at an upper portion than at a lower portion. A conformal spacer dielectric material is deposited in the spacer opening, wherein the conformal dielectric material merges in the upper portion of the spacer opening to enclose an air gap in the lower portion of the spacer opening, the conformal dielectric material providing sidewalls of a gate sidewall spacer. The method may continue with recessing at least a portion of the conformal dielectric material in the upper portion of the spacer opening, and forming an etch resistance cap material atop the recessed portion of the spacer dielectric material.

In another embodiment, a method of forming a semiconductor device is provided that includes providing a sacrificial gate structure on a channel region of semiconductor device, wherein sacrificial spacers are present on sidewalls of the sacrificial gate structure. The sacrificial gate structure may then be recessed. An interior surface of sacrificial spacers that is exposed by recessing the sacrificial gate conductor may then be laterally etched. The remainder of the sacrificial gate structure may then be substituted with a functional gate structure. The sacrificial spacer may be removed to provide a spacer opening having a lesser width at an upper portion than at a lower portion. A conformal spacer dielectric material is deposited in the spacer opening, wherein the conformal dielectric material merges in the upper portion of the spacer opening to enclose an air gap in the lower portion of the spacer opening, the conformal dielectric material providing sidewalls of a gate sidewall spacer. The method may continue with recessing at least a portion of the conformal dielectric material in the upper portion of the spacer opening, and forming an etch resistance cap material atop the recessed portion of the spacer dielectric material. Contacts may then be formed to source and drain regions of the semiconductor device, wherein the etch process for forming via opening for the contacts may be selective to the etch resistance cap material.

In another aspect, a semiconductor device is provided including a composite gate sidewall spacer including an air gap. The semiconductor device may include a gate structure on a channel region of a semiconductor device, wherein source and drain regions are on opposing sides of the channel region. A composite gate sidewall spacer is present on a sidewall of the gate structure, wherein the composite gate sidewall spacer includes a first composition portion having an air gap encapsulated therein, and a second composition portion that is entirely solid and present atop the first composition portion.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 6A is a side cross-sectional view across the length of the gate structure of removing at least a majority of the sacrificial spacer may to provide a spacer opening having a lesser width at an upper portion than at a lower portion, wherein the lesser width corresponds to the interior surface that was laterally etched, in accordance with one embodiment of present disclosure.

FIG. 6B is a side cross-sectional view along the length of the gate structure depicted in FIG. 6A.

FIG. 6C is a side cross-sectional view along the length of the sidewall spacer of the structure depicted in FIG. 6A.

FIG. 7A is a side cross-sectional view across the length of the gate structure of forming a conformal dielectric material in the spacer opening that merges in the upper portion of the spacer opening to enclose an air gap in the lower portion of the spacer opening, the conformal dielectric material providing sidewalls of a gate sidewall spacer, in accordance with one embodiment of the present disclosure.

FIG. 7B is a side cross-sectional view along the length of the gate structure depicted in FIG. 7A.

FIG. 7C is a side cross-sectional view along the length of the sidewall spacer of the structure depicted in FIG. 7A.

FIG. 8A is a side cross-sectional view across the length of the gate structure depicting recessing the conformal dielectric material in the upper portion of the spacer opening to form a cap opening, in accordance with one embodiment of the present disclosure.

FIG. 8B is a side cross-sectional view along the length of the gate structure depicted in FIG. 8A.

FIG. 8C is a side cross-sectional view along the length of the sidewall spacer of the structure depicted in FIG. 8A.

FIG. 9A is a side cross-sectional view across the length of the gate structure depicting depositing an etch resistant cap material filling the cap opening.

FIG. 9B is a side cross-sectional view along the length of the gate structure depicted in FIG. 9A.

FIG. 9C is a side cross-sectional view along the length of the sidewall spacer of the structure depicted in FIG. 9A.

FIG. 10B is a side cross-sectional view across the length of the gate structure depicted in FIG. 10A.

FIG. 10C is a side cross-sectional view along the length of the gate structure depicted in FIG. 10A.

FIG. 10D is a side cross-sectional view along the length of the sidewall spacer of the structure depicted in FIG. 10A.

DETAILED DESCRIPTION

Figure 1:
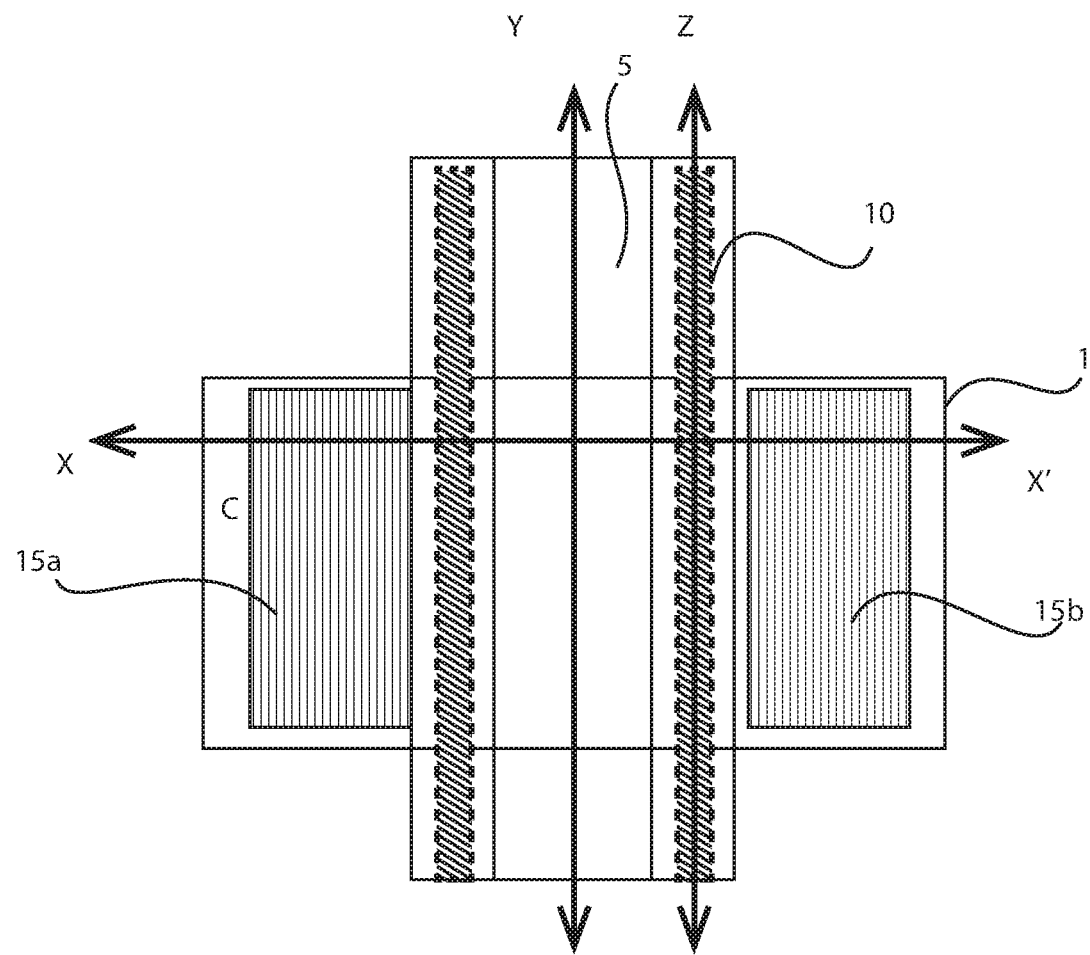
FIG. 1 is a top down structure depicting a replacement gate structure on a channel region of a semiconductor device, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a low-k spacer, i.e., a spacer including an air gap, for use in semiconductor devices. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. In some examples, the field effect transistor may be a planar device. In a planar device the gate structure is formed atop an upper surface of the substrate that provides the channel region of the device, in which source and drain regions are present on the substrate on opposing sides of the channel region.

The figures provided in the present disclosure illustrate planar semiconductor devices, but the methods and structures that are disclosed herein, are not limited to only this example, as other semiconductor device geometries are equally applicable. For example, the methods and structure disclosed herein may be applicable to FinFET semiconductor device. In a FinFET semiconductor device the channel region of the semiconductor device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. Any semiconductor device that includes low-k spacers, e.g., spacers including air gaps, may be suitable for use with the present disclosure.

It has been determined that airgap spacer, such as the spacers formed on the sidewalls of gate structures, are suitable for reducing device capacitance in semiconductor devices, such as field effect transistors (FETs). An air gap spacer is a dielectric spacer that includes an enclosed void. As used herein, an "air gap" means a void that is not filled with solid material. It may be filled with a liquid and/or a gas such as air. However, it has been determined that the presence of the air gap within a spacer adjacent to a gate structure can lead to the formation of a passage way that could fill with electrically conductive material during the manufacturing of the semiconductor device including the air gap spacers, which could result in the formation of a shorts to the gate structures, as well as other electrically conductive features of the device. In some embodiments, the methods and structures disclosed herein reduce the incidence of damaging spacers having air gaps present therein, which can result in an open air gap, by providing a more etch resistant material in the upper portion of the spacer. By positioning a more etch resistant material in the upper portion of the spacer, the spacer is less likely to be damaged by etch processes for forming the via openings for contacts to the source and drain region, which when misaligned can overlap the spacers. In some embodiments, by maintaining the integrity of the spacers solid sidewalls and upper surfaces, a void opening can be avoided, which would eliminate the formation of passageways through the spacer that can lead to shorting within the device. Further details of the methods and structures of the present disclosure are now discussed with greater detail with reference to FIGS. 1-10D.

FIG. 1 depicts one embodiment of a sacrificial gate structure 5 on the channel region of a semiconductor substrate 1, in which sacrificial spacers 10 are present abutting the sidewalls of the sacrificial gate structure 6. The term "sacrificial" as used to describe the replacement gate conductor denotes that the structure is present during the process sequence, but is not present in the final device structure, in which the replacement structure provides an opening that dictates the size and geometry of a later formed functional gate conductor.

The semiconductor substrate 1 may be composed of a semiconducting material including, but not limited to Si, strained Si, SiC, SiGe, SiGeC, Si alloys, Ge, Ge alloys, GaAs, InAs, InP as well as other III/V and II/VI compound semiconductors. The semiconductor substrate 1 may be a bulk semiconductor substrate or a semiconductor on insulator (SOI) substrate, e.g., silicon layer present on a buried oxide layer that is present on a base semiconductor substrate.

The sacrificial gate structure 5 is formed on the channel portion of the semiconductor substrate 1. The sacrificial material that provides the sacrificial gate structure 5 may be composed of any material that can be etched selectively to the underlying semiconductor substrate 1. In one embodiment, the sacrificial material that provides the sacrificial gate structure 5 may be composed of a silicon-containing material, such as polysilicon. Although, the sacrificial gate structure 5 is typically composed of a semiconductor material, the sacrificial gate structure 5 may also be composed of a dielectric material, such as an oxide, nitride or oxynitride material, or amorphous carbon.

The sacrificial material may be patterned and etched to provide the sacrificial gate structure 5. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate structure 5, while the exposed regions are removed using a selective etching process that removes the unprotected regions. Following formation of sacrificial gate structure 5, the photoresist may be removed.

Still referring to FIG. 1, at least one sacrificial spacer 10 may then be formed adjacent to the sacrificial gate structure 5, i.e., in direct contact with the sidewall of the sacrificial gate structure 5. The term "sacrificial" as used to describe the sacrificial spacer 10 denotes that the structure is present during the process sequence, but is not present in the final device structure, in which the replacement structure provides an opening that dictates the size and geometry of a later formed composite spacer. The sacrificial spacer 10 may be composed of any material that can be removed, e.g., etched, selectively to at least a subsequently formed functional gate structure, and/or the semiconductor substrate 1, and/or a subsequently formed interlevel dielectric 20. In some embodiments, the sacrificial spacer 10 may be of a dielectric material, such as a nitride. For example, the sacrificial spacer 10 can be composed of silicon nitride. In other examples, the sacrificial spacer 10 can be composed of silicon oxide, boron nitride, silicon carbon or any suitable combination of those materials. In some embodiments, the sacrificial spacer 10 can be formed by a processes sequence that can begin with conformal deposition of a dielectric material layer on sidewalls of the sacrificial gate structure 5. The deposition process used for forming the dielectric material layer for the sacrificial spacer 10 may be chemical vapor deposition (CVD), such as plasma enhanced chemical vapor deposition (PECVD) or metal organic chemical vapor deposition (MOCVD). An anisotropic etch, e.g., reactive ion etch (RIE), may then remove the portions of the dielectric material for the sacrificial spacer 10 that are not present on the sidewalls of the sacrificial gate structure 5. The remaining portion of the dielectric material that is present on the sidewalls of the sacrificial gate structure 5 provides the sacrificial spacer 10. In one example, the sacrificial spacer 10 is composed of silicon nitride.

In some embodiments, extension source regions and the drain region (not shown) may then be formed in the portions of the semiconductor substrate that are present on opposing sides of sacrificial gate structure 5. In one embodiment, the extension source region and the extension drain region are formed using in situ doping, an ion implantation process, plasma doping, gas phase diffusion, diffusion from a doped oxide or a combination thereof. The conductivity type of the extension source region and the extension drain region typically dictates the conductivity type of the semiconductor device. As used herein, "p-type" refers to the addition of impurities to an intrinsic semiconductor that creates deficiencies of valence electrons. In a silicon-containing semiconductor substrate 1, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing semiconductor substrate 1 examples of n-type dopants, i.e., impurities, include but are not limited to antimony, arsenic and phosphorous.

FIG. 1 further depicts forming raised source and drain regions 15a, 15b. The term "raised" as used to describe the raised source and drain regions 15a, 15b means that the lower surface of the raised source and drain regions 15a, 15b is in direct physical contact with the surface of the semiconductor substrate 1 on which the gate dielectric of the functional gates structure is present. The raised source and drain regions 15a, 15b may be formed using a selective epitaxial growth process. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. The fact that the process is selective means that the deposited semiconductor material grows only on exposed semiconductor regions and does not grow on a dielectric, such as silicon oxide. The epitaxial growth process may be continued until the raised source and drain regions 15a, 15b have a height ranging from 5 nm to 50 nm, as measured from the upper surface of the semiconductor substrate 1. Typically, the raised source and drain regions 15a, 15b are composed of a silicon containing material, such as silicon, silicon germanium, or silicon doped with carbon (Si:C).

Similar to the extension source and drain regions, the conductivity type of the raised source and drain regions 15a, 15b typically dictates the conductivity type of the semiconductor device. In some embodiments, the dopant that dictates the conductivity type of the raised source and drain regions 15a, 15b is introduced in-situ. By "in-situ" it is meant that the dopant that dictates the conductivity type of the raised source and drain regions 15a, 15b is introduced during the process step, e.g., epitaxial deposition, that forms the raised source and drain regions 15a, 15b. Alternatively, the dopant that provides the conductivity type of the raised source and drain regions 15a, 15b is introduced by ion implantation.

An interlevel dielectric layer 20 may be formed overlying the raised source and drain regions 15a, 15b, and planarizing the interlevel dielectric layer 20 to be coplanar with an upper surface of the sacrificial gate structure 5. The interlevel dielectric 20 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 35 include any of the aforementioned materials in porous form, or in a form that changes during processing to or from being porous and/or permeable to being non-porous and/or non-permeable. The interlevel dielectric layer 20 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the dielectric material for the interlevel dielectric layer 20, a planarization processes is conducted to provide an upper surface, wherein the upper surface of the interlevel dielectric layer 20 is coplanar with the upper surface of the surficial gate structure 5. The planarization of the interlevel dielectric layer 20 may be provided by chemical mechanical planarization.

Figure 2A:
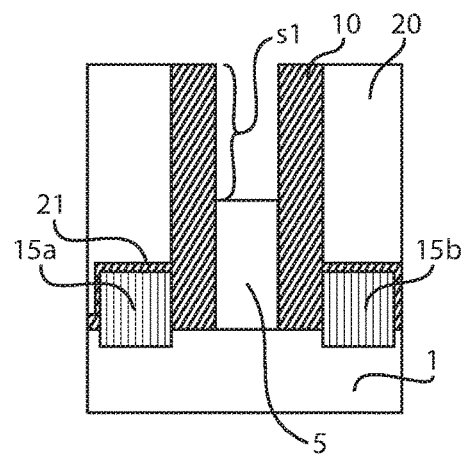
FIG. 2A is a side cross-sectional view along section line X-X' (hereafter referred to across the length of the gate structure) of the structure depicted in FIG. 1 of recessing a sacrificial gate conductor relative to sacrificial spacers that are abutting the sacrificial gate structure to expose an interior surface of sacrificial spacers, in accordance with one embodiment of present disclosure.
Figure 2B:
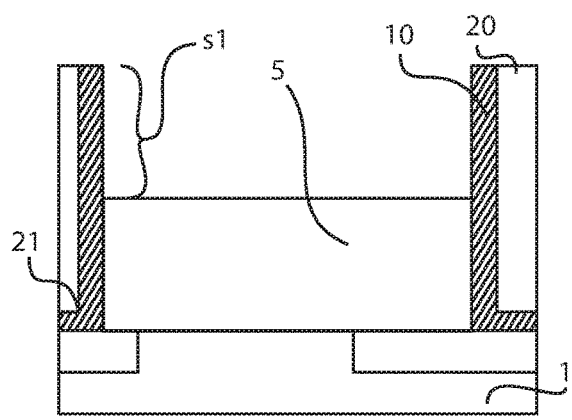
FIG. 2B is a side cross-sectional view along section line Y-Y (hereafter referred to as along the length of the gate structure) of structure depicted in FIG. 1 depicting recessing the sacrificial gate structure.
Figure 2C:
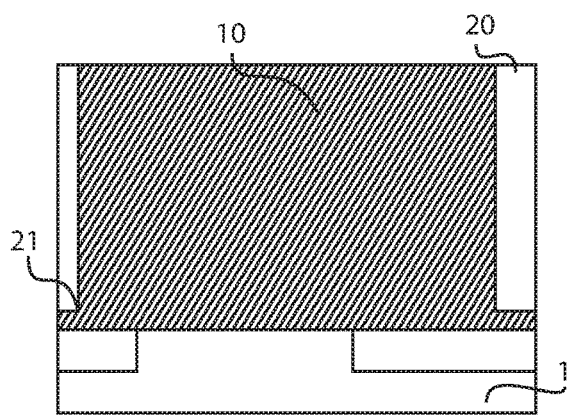
FIG. 2C is a side cross-sectional view along section line Z-Z (hereafter referred to as along the length of the sidewall spacer) of the structure depicted in FIG. 1 depicting recessing the sacrificial gate structure.

FIGS. 2A-2C depict one embodiment of recessing the sacrificial gate structure 5 relative to sacrificial spacers 10 that are abutting the sacrificial gate structure 5 to expose an interior surface 51 of sacrificial spacers 10. The sacrificial gate structure 5 may be recessed by an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The etch process for recessing the sacrificial gate structure 5 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

In some embodiments, the etch process for recessing the sacrificial gate structure 5 removes the material of the sacrificial gate structure 5 selectively to the sacrificial spacers 10. The sacrificial gate structure 5 may be recessed from ¼ of the sacrificial gate structures height to ¾ of the sacrificial gate structures height. In one embodiment the height of the gate structure 5 maybe recessed by approximately half of the gate structure's 5 original height. In some embodiments, the interior surface Si of sacrificial spacers 10 that are exposed by the recessing the sacrificial gate structure 5 may range from 5 nm to 100 nm. In some embodiments, the interior surface Si of the sacrificial spacers 10 that may be exposed may range from 5 nm to 30 nm.

Figure 3A:
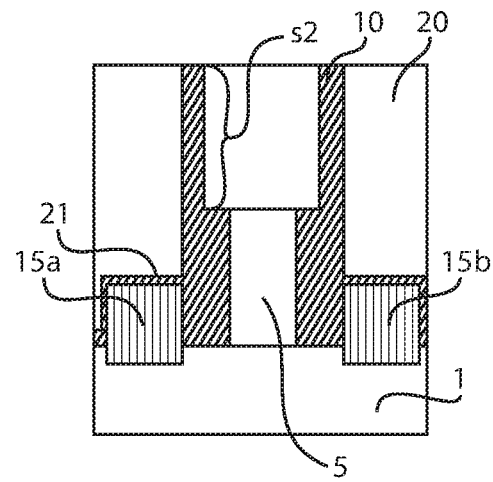
FIG. 3A is a side cross-sectional view across the length of the gate structure depicting one embodiment of laterally etching the interior surface of the sacrificial spacers, in accordance with one embodiment of the present disclosure.
Figure 3B:
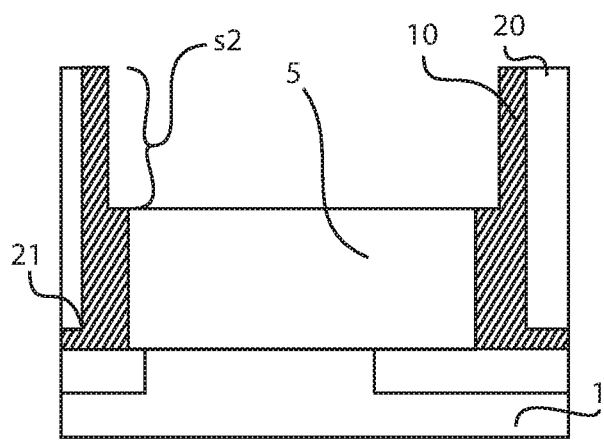
FIG. 3B is a side cross-sectional view along the length of the gate structure of the structure depicted in FIG. 3A.

FIGS. 3A and 3B depict one embodiment of laterally etching the interior surface Si of the sacrificial spacers 10 to form a stepped interior sidewall S2 for the sacrificial spacers 10. In some examples, the lateral etching may be provided by an isotropic etch. Contrary to anisotropic etching, in which the etch rate in one direction exceeds the remaining directions, in isotropic etching the etch rate in substantially all directions is substantially the same. Therefore, the etch process may remove material from the interior surface Si of the sacrificial spacers 10 laterally, i.e., in a direction substantially parrallel to the plane defined by the upper surface of the substrate 1. In some embodiments, the etch process for laterally etching the interior sidewall of the sacrificial spacers 10 and forming the stepped interior sidewall S2 may be selective to the recessed sacrificial gate structure 5 and the interlevel dielectric 20. In one embodiment, the etch process for laterally etching the interior sidewall of the sacrificial spacer 10, reduces the width of the etched portion of the sacrificial spacer 10, i.e., stepped interior sidewall S2 portion, by a width dimension of 1 nm to 10 nm. In other embodiments, the etch process for laterally etching the interior sidewall of the sacrificial spacer 10, reduces the width of the etched portion of the sacrificial spacer 10, i.e., stepped interior sidewall S2 portion, by a width dimension of 2 nm to 5 nm. The portion of the sacrificial spacer 10 having the stepped interior sidewall S2 provides the opening portion at the upper surface of the later formed spacer opening which has a lesser width than a base portion of the spacer opening in which the air gap is formed.

Figure 4A:
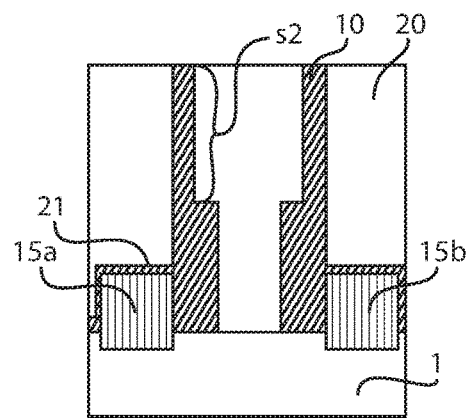
FIG. 4A is a side cross-sectional view across the length of the gate structure depicting one embodiment of removing a remainder of the sacrificial gate structure, in accordance with one embodiment of the present disclosure.
Figure 4B:
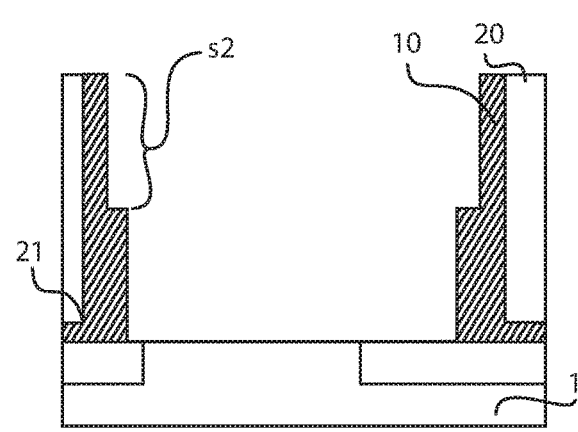
FIG. 4B is a side cross-sectional view along the length of the gate structure of the structure depicted in FIG. 4A.

FIGS. 4A and 4B depict one embodiment of removing a remainder of the sacrificial gate structure 5. The sacrificial gate structure 5 may be removed by a selective etch process. For example, the sacrificial gate structure 5 may be removed using an etch process that is selective to at least the sacrificial spacer 10 and the interlevel dielectric layer 20. The selective etch process may be a wet or dry etch process. In one embodiment, the sacrificial gate structure 5 is removed by reactive ion etch (RIE). When composed of polysilicon, the sacrificial gate structure 5 may be removed using etch chemistries, such as HBr, $SF_6$, and $NH_4OH$.

Figure 5A:
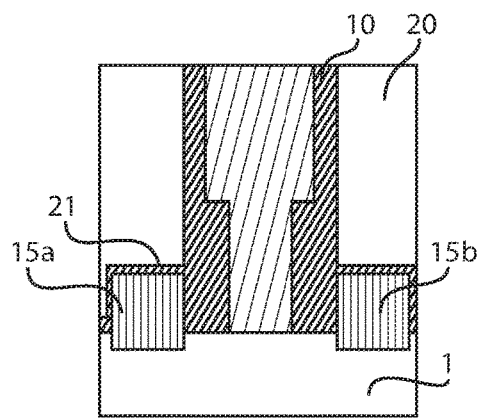
FIG. 5A is a side cross-sectional view across the length of the gate structure of forming a functional gate structure in the gate opening formed by removing the sacrificial gate structure, in accordance with one embodiment of the present disclosure.
Figure 5B:
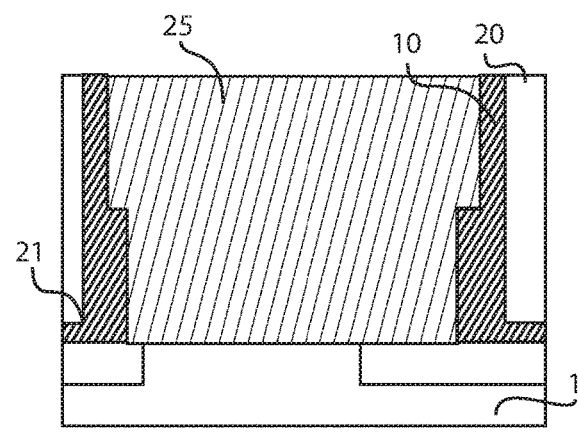
FIG. 5B is a side cross-sectional view along the length of the gate structure of the structure depicted in FIG. 5A.
Figure 10A:
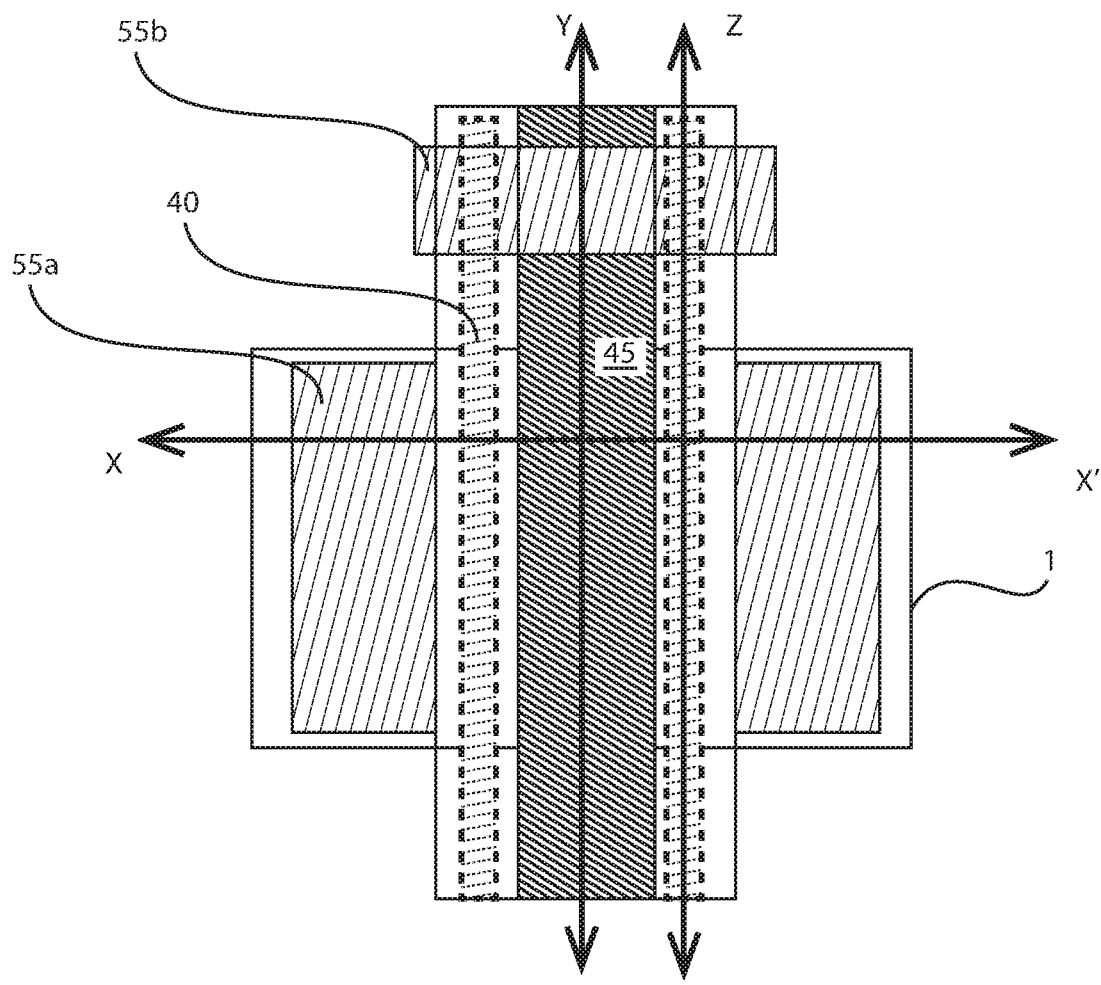
FIG. 10A is a top down view depicting forming contacts to the semiconductor device, in accordance with one embodiment of the present disclosure.

FIGS. 5A and 5B depicts forming a functional gate structure 25 in the opening formed by removing sacrificial gate structure 5 to the channel region portion of the semiconductor substrate 1. The "functional gate structure" operates to switch the semiconductor device from an "on" to "off" state, and vice versa. The functional gate structure 25 typically includes at least on gate dielectric and at least one gate conductor. In one embodiment, the at least one gate dielectric includes, but is not limited to, an oxide, nitride, oxynitride and/or silicates including metal silicates, aluminates, titanates and nitrides. In one example, when the at least one gate dielectric is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The conductive material of the gate conductor may comprise polysilicon, SiGe, a silicide, a metal or a metal-silicon-nitride such as Ta—Si—N. Examples of metals that can be used as the gate conductor include, but are not limited to, Al, W, Cu, and Ti or other like conductive metals. The layer of conductive material for the gate conductor may be doped or undoped. If doped, an in-situ doping deposition process may be employed. Alternatively, a doped conductive material can be formed by deposition, ion implantation and annealing.

The at least one gate dielectric may be formed using a deposition process, such as chemical vapor deposition (CVD). Examples of CVD processes for forming the at least one gate dielectric include chemical vapor deposition (CVD), plasma enhanced chemical vapor deposition (PECVD), physical vapor deposition (PVD), atomic layer deposition (ALD) and other like deposition processes. The at least one gate dielectric may also include material layers formed using a thermal growth process, such as thermal oxidation. The at least one gate conductor may be formed on the at least one gate dielectric. The at least one gate conductor may be formed using a deposition process. For example, when the at least one gate conductor is composed of a semiconductor material, the at least one gate conductor may be formed using may be formed using a deposition process, such as chemical vapor deposition (CVD). Examples of CVD processes for forming the at least one gate conductor include chemical vapor deposition (CVD), plasma enhanced chemical vapor deposition (PECVD), atomic layer deposition (ALD) and other like deposition processes. In another embodiment, when the at least one gate conductor is composed of a metal, the at least one gate conductor is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering. Following the formation of the gate conductor, the upper surface of the gate conductor layer may be planarized to be coplanar with the upper surface of the interlevel dielectric 20 and the sacrificial spacer 10. The planarization process may include chemical mechanical planarization (CMP).

FIGS. 6A-6C depict removing at least a majority of the sacrificial spacer 10 to provide a spacer opening 11 having a lesser width W1 at an upper portion than at a lower portion of the spacer opening 11. The lesser width W1 of the spacer opening 11 corresponds to the interior surface S2 of the sacrificial spacer 10 that was laterally etched, i.e., stepped surface S2. The sacrificial spacer 10 may be removed by a process that removes the material of the sacrificial spacer 10 selectively to at least one of functional gate structure 25, and the interlevel dielectric 20. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. In some embodiments, the sacrificial spacer 10 may be removed by a dry process, such as reactive ion etch, or a wet chemical etch. The etch process for removing the sacrificial spacer 10 may be selective to the functional gate structure 25 and the interlevel dielectric layer 20.

In some embodiments, the etch process for removing the sacrificial spacer 10 is selective to the semiconductor substrate 1. In this embodiment, the sacrificial spacer 10 can be removed in its entirety. In some other examples, the sacrificial spacer 10 is removed by an etch process that is timed to leave a portion, i.e., remaining portion 9, of the sacrificial spacer at the base of the spacer opening 11.

FIGS. 7A-7C depict one embodiment of forming a conformal dielectric material 30 in the spacer opening 11 that merges in the upper portion of the spacer opening 11 to enclose an air gap 35 in the lower portion of the spacer opening 11. The conformal dielectric material 30 provides the sidewalls of at least a lower portion of the gate sidewall spacer. The term "conformal" denotes a layer having a thickness that does not deviate from greater than or less than 30% of an average value for the thickness of the layer. In some embodiments, the conformal dielectric material 30 may be a conformally deposited material layer that composed of any dielectric material, such as a nitrogen containing dielectric, e.g., silicon nitride; an oxide containing dielectric, e.g., silicon oxide ($SiO_2$); or a combination thereof, such as silicon oxynitride, so long as the material selected for the conformal dielectric material 30 allows for encapsulating the air gap 35 in the lower portion of the spacer opening 11. In one example, the conformal dielectric material 30 may be composed of silicon nitride.

It is noted that the silicon nitride and silicon oxide are only some examples of dielectric material that are suitable for the conformal dielectric material 30, and it is not intended that the present disclosure be limited to only these examples. For example, in some other embodiments, the conformal dielectric material 30 may be composed of a low-k dielectric material. In one embodiment, the low-k material that provides the conformal dielectric material 30 may have a dielectric constant ranging from 1.0 to 3.5. In another embodiment, the low-k material that provides the low-k dielectric material that provides the conformal dielectric material 30 may have a dielectric constant ranging from 1.75 to 3.2. Examples of materials suitable for the low-k dielectric material that provides the conformal dielectric material 30 may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof.

The conformal dielectric material 30 can be deposited using chemical vapor deposition (CVD). Examples of chemical vapor deposition processes for forming the conformal dielectric material 30 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The conformal dielectric material 30 may be deposited so that a first portion of the conformal dielectric material 30 is conformally deposited on the sidewalls and the base of the spacer opening 11, and that a second portion of the conformal dielectric material 30 is present on the upper portion of the spacer opening 11, which corresponds to the stepped sidewall S2 of the sacrificial spacer 10, having a thickness so that the portions of the conformal dielectric material 30 on opposing sidewalls contact one another enclosing the air gap 35 in the lower portion of the spacer opening 11.

The thickness of the conformal dielectric material 30 is at least half the width of the upper portion of the spacer opening 11 so that the conformal dielectric material 30 formed on the opposing stepped sidewalls of the spacer opening 11 merge to pinch off the lower portion of the spacer opening 11, which forms an air cap enclosed in dielectric material in the lower portion of the spacer opening 11. In some embodiments, the conformal dielectric material 30 that is present in the lower portion of the spacer opening 11 is deposited to a thickness ranging from 1 nm to 15 nm. In another embodiment, the conformal dielectric material 30 may have a thickness ranging from 2 nm to 5 nm.

The air gap 35 may have a height ranging from 5 nm to 50 nm, and a width ranging from 1 nm to 10 nm, in which the air gap 35 extends across an entire length of the composite spacer.

FIGS. 8A-8C depicts recessing the conformal dielectric material 30 in the upper portion of the spacer opening 11 to form a cap opening 31. The conformal dielectric material 30 may be recessed by an anisotropic etch. The anisotropic etch may include reactive-ion etching (RIE). Other examples of anisotropic etching that can be used at this point of the present disclosure include ion beam etching, plasma etching or laser ablation. The etch process for recessing the conformal dielectric material 30 may be a selective etch process. In some embodiments, the etch process for recessing the conformal dielectric material 30 removes the material of the conformal dielectric material 30 selectively to the functional gate structure 25 and the interlevel dielectric 20. The conformal dielectric material 30 may be recessed by a dimension ranging from 2 nm to 25 nm. In some embodiments, the conformal dielectric material 30 may be recessed by a dimension ranging from 10 nm to 20 nm.

FIGS. 9-9C depict one embodiment of depositing an etch resistance cap material 40 atop the recessed portion of the conformal dielectric material 30. The term "etch resistant" denotes that the etch selectivity of the material provides that the interlevel dielectric 20 may be removed selectively to the etch resistance cap material 40. For example, the material composition of the etch resistant cap material 40 is selected so that the subsequently described etch process for forming the via openings through the interlevel dielectric 20 has a selectivity for removing the interlevel dielectric 20 to the etch resistance cap material 40 with an etch selective of 2:1 or greater. In other embodiments, the composition of the etch resistance cap material 40 is selected so that the etch selectivity for removing the interlevel dielectric 20 to the etch resistance cap material 40 with an etch selective of 3:1 or greater.

In some embodiments, the composition of the etch resistant cap material 40 may be $HfO_2$, $ZrO_2$, $Al_2O_3$, $TiO_2$, $La_2O_3$, $SrTiO_3$, $LaAlO_3$, $Y_2O_3$ and mixtures thereof. In some other embodiments, the composition of the etch resistant cap material 40 may be hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof. In even further embodiments, the etch resistant cap material 40 may be composed of silicon carbon boron nitride (SiCBN) or boron nitride.

The deposition process used for forming the dielectric material for the etch resistant cap material 40 may be a chemical vapor deposition (CVD) process, such as Atmospheric Pressure CVD (APCVD), Low Pressure CVD (LPCVD), Plasma Enhanced CVD (PECVD), Metal-Organic CVD (MOCVD) and combinations thereof may also be employed. The deposition process for the etch resistance cap material 40 may be continued until the entirety of the cap opening 31 is filled with the etch resistance cap material 40. In some embodiments, a planarization process may be used to provide that the upper surface of the etch resistance cap material 40 is coplanar with the upper surface of the interlevel dielectric 20 and the functional gate structure 25.

In some embodiments, the etch resistance cap material 40 and the conformal dielectric material 30 that encloses the air gap 35 provide a composite spacer adjacent to the functional gate structure 25. The air gap 35 of the composite spacer provides a low-k dielectric spacer for reducing device capacitance in semiconductor devices, such as field effect transistors (FETs), when compared to the device capacitance of solid dielectric spacers that are composed of higher dielectric constant materials. In some embodiments, a composite gate sidewall spacer is provided in direct contact with a sidewall of the functional gate structure 25, wherein the composite gate sidewall spacer includes a first composition portion 30 (provided by the conformal dielectric material 30) having an air gap 35 encapsulated therein, and a second composition portion 40 (provided by the etch resistance cap material 40) that is entirely solid and present atop the first composition portion 30. The etch resistance cap material 40, the conformal dielectric material 30 and the air gap 35 may be collectively referred to as the composite spacer 30, 35, 40.

FIGS. 10A-10D depict forming a gate dielectric cap 45 and forming contacts 55a, 55b to the semiconductor device. More specifically, in some embodiments, process steps following filling the cap opening 31 with etch resistance cap material 40 may include forming a gate dielectric cap 45, forming a second interlevel dielectric layer 50, forming a via opening, and forming a contacts 55a, 55b within the via openings. The gate dielectric cap 45 may be formed using a deposition process, such as chemical vapor deposition (CVD). The gate dielectric cap 45 may be composed of an oxide or nitride containing dielectric, such as silicon oxide or silicon nitride. In some embodiments, a planarization process, such as chemical mechanical planarization (CMP), may be performed so that the upper surface of the gate dielectric cap 45 is coplanar with an upper surface of the interlevel dielectric layer 20.

Following the formation of the gate dielectric cap 45, an additional layer of interlevel dielectric material, i.e., second interlevel dielectric layer 50, may be deposited, and contacts 55a may be formed to the source and drain regions 15a, 15b of the semiconductor device, as well as contacts 55b to the functional gate structure 25. To form the contacts 55a, 55b, the additional layer of the interlevel dielectric material 50 may be patterned and etched to form via holes to the various source/drain and gate conductor, i.e., function gate structure 25, regions of the device. In the event of any misalignment of the etch masking for forming the via openings for the contacts 55a, 55b to the source and drain regions and/or functional gate structure 25, which causes the via openings to overlap the composite spacer 30, 35, 40, the etch resistance cap material 40 protects the integrity of the conformal dielectric 30 so that the air gap 35 can not be opened by the etch processes for forming the via openings for the contacts 55a, 55b.

In some embodiments, the via openings may be formed using photolithography and etch processes. For example, a photoresist etch mask can be produced by applying a photoresist layer to the upper surface of the second interlevel dielectric layer 50, exposing the photoresist layer to a pattern of radiation, and then developing the pattern into the photoresist layer utilizing a resist developer. The photoresist etch mask may be positioned so that the portions of the second interlevel dielectric layer 50 that are not protected by the photoresist etch mask are etched to provide the via openings to the source and drain regions 15a, 15b.

Via openings may then be etched through the second interlevel dielectric layer 50, and the first interlevel dielectric layer 20 to expose a contact portion of the epitaxial semiconductor material on the source and drain region portions 15a, 15b of the semiconductor device. Via openings may also be etched through the second interlevel dielectric layer 50, the first interlevel dielectric layer 20 and the gate dielectric cap 45 to expose a contact portion of the functional gate structure 25. The etch process for forming the via openings may be an anisotropic etch process, such as reactive ion etch (RIE). As noted above, in some embodiments, when there is mask misalignment for forming the via openings, the etch resistance portion 40 of the composite spacer may protect the portion of the spacer (conformal dielectric 30 portion) that is enclosing the air gap 35 of the composite spacer 30, 35, 40 from being damaged by the via opening etch.

Following via formation, the contacts 55a, 55b are formed by depositing a conductive metal into the via holes using deposition methods, such as CVD or physical vapor deposition (PVD). Physical vapor deposition methods (PVD) may include plating, electroplating, electroless plating, sputtering and combinations thereof. The conductive metal may include, but is not limited to: tungsten, copper, aluminum, silver, gold and alloys thereof.

FIGS. 10A-10D depict one embodiment of a semiconductor device that includes a composite gate sidewall spacer 30, 35, 40 including an air gap 35. The semiconductor device may include a gate structure 25 on a channel region of a semiconductor device, wherein source and drain regions 15a, 15b are on opposing sides of the channel region. A composite gate sidewall spacer 30, 35, 40 is present on a sidewall of the gate structure 25, wherein the composite gate sidewall spacer includes a first composition portion (conformal dielectric portion 30) having an air gap 35 encapsulated therein, and a second composition portion (etch resistance cap material 40) that is entirely solid and present atop the first composition portion. By being entirely solid it is meant that an air gap is not present in the etch resistance cap material 40.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a gate structure on a channel region of a semiconductor device, wherein source and drain regions are on opposing sides of the channel region, wherein the semiconductor device further comprises a fin structure; and
   a composite gate sidewall spacer present on a sidewall of the gate structure, wherein the composite gate sidewall spacer includes a first composition portion having an air gap encapsulated therein, and a second composition portion that is entirely solid.

2. The semiconductor device of claim 1, wherein the first composition is a dielectric material that is different from a dielectric material of the second composition.

3. The semiconductor device of claim 1, wherein the first composition portion is present atop a substrate, and the second composition portion is present on the first composition portion.

4. The semiconductor device of claim 3, wherein the first composition portion has a width that is greater than the second composition portion.

5. The semiconductor device of claim 1, wherein the source and drain regions are comprised of n-type or p-type doped epitaxial semiconductor material.

6. The semiconductor device of claim 1, wherein the first composition portion includes a conformal dielectric layer encapsulating the air gap, wherein the conformal dielectric layer comprises a dielectric selected from the group consisting of silicon nitride; silicon oxide ($SiO_2$); silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof.

7. The semiconductor device of claim 1, wherein the second composition portion includes a dielectric composition selected from the group consisting of $HfO_2$, $ZrO_2$, $Al_2O_3$, $TiO_2$, $La_2O_3$, $SrTiO_3$, $LaAlO_3$, $Y_2O_3$ and mixtures thereof.

8. The semiconductor device of claim 1, wherein the second composition portion includes a dielectric composition selected from the group consisting of hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof.

9. A semiconductor device comprising:
a gate structure on a channel region of a semiconductor device, wherein source and drain regions are on opposing sides of the channel region, wherein the gate structure comprises a gate conductor having a lesser width at its interface with a gate dielectric than its width at its upper surface; and
a composite gate sidewall spacer present on a sidewall of the gate structure, wherein the composite gate sidewall spacer includes a first composition portion having an air gap encapsulated therein, and a second composition portion that is entirely solid.

10. A semiconductor device comprising:
a gate structure on a channel region of a fin structure, wherein source and drain regions are on opposing sides of the channel region; and
a composite gate sidewall spacer present on a sidewall of the gate structure, wherein the composite gate sidewall spacer includes a first composition portion having an air gap encapsulated therein, and a second composition portion present atop the first composition portion, wherein the first portion has a greater width than the second portion.

11. The semiconductor device of claim 10, wherein the second composition portion is entirely solid.

12. The semiconductor device of claim 10, wherein the first composition is a dielectric material that is different from a dielectric material of the second composition.

13. The semiconductor device of claim 10, wherein the first composition portion is present atop a substrate that supports the fin structure, and the second composition portion is present on the first composition portion.

14. The semiconductor device of claim 10, wherein the source and drain regions are comprised of an epitaxial semiconductor material doped to an n-type or p-type conductivity.

15. The semiconductor device of claim 10, wherein the first composition portion includes a conformal dielectric layer encapsulating the air gap, wherein the conformal dielectric layer comprises a dielectric selected from the group consisting of silicon nitride; silicon oxide ($SiO_2$); silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof.

16. The semiconductor device of claim 10, wherein the second composition portion includes a dielectric composition selected from the group consisting of $HfO_2$, $ZrO_2$, $Al_2O_3$, $TiO_2$, $La_2O_3$, $SrTiO_3$, $LaAlO_3$, $Y_2O_3$ and mixtures thereof.

17. The semiconductor device of claim 10, wherein the second composition portion includes a dielectric composition selected from the group consisting of hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof.

18. The semiconductor device of claim 10, wherein the gate structure includes at least one gate dielectric in direct contact with the channel region of the fin structure, and at least one gate conductor on the at least one gate dielectric.

19. The semiconductor device of claim 10, wherein the gate structure comprises a gate conductor having a lesser width at its interface with a gate dielectric than its width at its upper surface.

* * * * *